(12) United States Patent
Dudek et al.

(10) Patent No.: US 11,784,261 B2
(45) Date of Patent: Oct. 10, 2023

(54) STACKED III-V SEMICONDUCTOR DIODE

(71) Applicants: 3-5 Power Electronics GmbH, Dresden (DE); AZUR SPACE Solar Power GmbH, Heilbronn (DE)

(72) Inventors: Volker Dudek, Ettlingen (DE); Jens Kowalsky, Storkow (DE); Riteshkumar Bhojani, Chemnitz (DE); Daniel Fuhrmann, Heilbronn (DE); Thorsten Wierzkowski, Heilbronn (DE)

(73) Assignees: AZUR SPACE Solar Power GmbH, Heilbronn (DE); 3-5 Power Electronics GmbH, Dresden (DE)

( * ) Notice: Subject to any disclaimer, the term of this patent is extended or adjusted under 35 U.S.C. 154(b) by 74 days.

(21) Appl. No.: 17/667,105

(22) Filed: Feb. 8, 2022

(65) Prior Publication Data

US 2022/0254936 A1 Aug. 11, 2022

(30) Foreign Application Priority Data

Feb. 8, 2021 (DE) ..................... 10 2021 000 610.0

(51) Int. Cl.
*H01L 29/868* (2006.01)
*H01L 29/207* (2006.01)

(52) U.S. Cl.
CPC .......... *H01L 29/868* (2013.01); *H01L 29/207* (2013.01)

(58) Field of Classification Search
CPC ... H01L 29/36; H01L 29/207; H01L 29/0684; H01L 29/66204; H01L 29/66212;
(Continued)

(56) References Cited

U.S. PATENT DOCUMENTS

| 5,013,685 A | 5/1991 | Chiu et al. |
| 6,614,087 B1 * | 9/2003 | Morishita ............... H01L 29/36 257/470 |

(Continued)

FOREIGN PATENT DOCUMENTS

| CN | 103178120 A | 6/2013 |
| DE | 102016111844 A1 | 12/2017 |

(Continued)

OTHER PUBLICATIONS

Koel et al., "Characterization of the temperature dependent behavior of snappy phenomenon by switching-off of GaAs power diode structures," Adv in Fluid Mechanics XI, No. 1, pp. 439-449, XP055545469 (Jul. 1, 2014).

(Continued)

*Primary Examiner* — Jose R Diaz

(74) *Attorney, Agent, or Firm* — Muncy, Geissler, Olds & Lowe , P.C.

(57) ABSTRACT

A stacked III-V semiconductor diode comprising or consisting of GaAs, with a heavily n-doped cathode layer, a heavily p-doped anode layer, and a drift region arranged between the cathode layer and the anode layer with a dopant concentration of at most $8 \cdot 10^{15}$ cm$^{-3}$, and a layer thickness of at least 10 μm, wherein the cathode layer has a delta layer section with a layer thickness of 0.1 μm to 2 μm and a dopant concentration of at least $1 \cdot 10^{19}$ cm$^{-3}$.

18 Claims, 2 Drawing Sheets

(58) Field of Classification Search
CPC .............. H01L 29/861; H01L 29/8611; H01L 29/8613; H01L 29/868
See application file for complete search history.

(56) References Cited

U.S. PATENT DOCUMENTS

| | | | |
|---|---|---|---|
| 10,074,540 B2 | 9/2018 | Dudek | |
| 10,186,587 B2 | 1/2019 | Kuenle et al. | |
| 10,263,124 B2 | 4/2019 | Dudek | |
| 10,529,802 B2 | 1/2020 | Kuenle et al. | |
| 10,854,760 B2 | 12/2020 | Dudek | |
| 2004/0084724 A1 | 5/2004 | Kapels et al. | |
| 2007/0108558 A1* | 5/2007 | Nemoto | H01L 29/66136 257/656 |
| 2011/0291223 A1 | 12/2011 | Nakamura | |
| 2016/0056306 A1* | 2/2016 | Masuoka | H01L 29/872 257/483 |

FOREIGN PATENT DOCUMENTS

| | | |
|---|---|---|
| DE | 10 2018 000 395 A1 | 7/2019 |
| EP | 3321971 B1 | 10/2019 |
| EP | 3321970 B1 | 2/2020 |
| JP | H03155125 A | 7/1991 |
| JP | 2005032928 A | 2/2005 |
| JP | 2012164753 A | 8/2012 |

OTHER PUBLICATIONS

Toompuu et al., "GaAs Based Diffusion Welded High Voltage Diode Stacks," IEEE Intl Conf on Semiconductor Electronics (ICSE), pp. 1-4, XP031733516 (Jun. 28, 2010).
Maassdorf et al., "Gowth and characterization of heavily selenium doped GaAs using MOVPE," J. of Crystal Growth, vol. 315, No. 1, pp. 57-60, XP028137722 (Sep. 24, 2010).
Yakushieva et al., "Doping of GaAs with Donor Impurities Te and Sn During Liquid Phase Epitaxy from Mixed Gallium-Bismuth Melts," Crystal Research & Tech, vol. 27, No. 1, XP055930122 (Jan. 1, 1992).
Schubert et al., "Delta-doped ohmic contacts to n-GaAs," AIP Applied Phys Letts, vol. 49, No. 5, XP000815323 (Aug. 1, 1986).
Lebedeva et al., "Effect of a wideband heteroepitaxial emitter on dynamics of turn-off switching of high-voltage power GaAs p-i-n diodes,", J of Phys, Conf Series, vol. 690, No. 1, pp. 1-3, XP020296758 (Feb. 26, 2016).
German Ashkinazi: "GaAs Power Devices," ISBN 965-7094-19-4, pp. 8 and 9 (1999).

* cited by examiner

STACKED III-V SEMICONDUCTOR DIODE

This nonprovisional application claims priority under 35 U.S.C. § 119(a) to German Patent Application No. 10 2021 000 610.0, which was filed in Germany on Feb. 8, 2021, and which is herein incorporated by reference.

BACKGROUND OF THE INVENTION

Field of the Invention

The present invention relates to a stacked III-V semiconductor diode comprising or consisting of GaAs with a heavily n-doped cathode layer, a heavily p-doped anode layer, and a drift region arranged between the cathode layer and the anode layer.

Description of the Background Art

A high-voltage-resistant semiconductor diode with a $p^+$-n-$n^+$ structure made of gallium arsenide is known from "GaAs Power Devices" by German Ashkinazi, ISBN 965-7094-19-4, pages 8 and 9.

Further stacked III-V semiconductor diodes are known from EP 3 321 971 B1 and from EP 3 321 970 B1, wherein the semiconductor diodes have an additional intermediate layer between the drift region and the cathode or anode.

SUMMARY OF THE INVENTION

It is therefore an object of the present invention to provide a device that refines the prior art.

According to an exemplary embodiment of the invention, a stacked III-V semiconductor diode comprising or consisting of GaAs is provided, with a heavily n-doped cathode layer and a heavily p-doped anode layer.

A drift region with a dopant concentration of at most $8 \cdot 10^{15}$ cm$^{-3}$ and a layer thickness of at least 10 µm is arranged between the cathode layer and the anode layer. The total layer thickness of the drift region is preferably a maximum of 50 µm or a maximum of 100 µm.

The cathode layer has a first section and a second section.

The first section is formed as a delta layer section with a layer thickness between 0.1 µm and 1 µm or between 0.1 µm and 2 µm.

The delta layer section has a dopant concentration of at least $1 \cdot 10^{19}$ cm$^{-3}$ or at least $2 \cdot 10^{19}$ cm$^{-3}$.

It is understood that all semiconductor layers of a semiconductor diode consisting of GaAs or comprising GaAs, therefore, in particular the cathode layer, the anode layer, and the drift region, each consist of GaAs or at least comprise GaAs. Stated differently, each semiconductor layer of the III-V semiconductor diode has at least the elements Ga and As.

Furthermore, it is understood that a PN junction is formed within the drift region.

It should be noted that the semiconductor layers of the semiconductor diode are formed stack-shaped on top of one another. The semiconductor layers preferably have the same area. One of the semiconductor layers is preferably formed as a substrate layer or comprises a substrate layer. In one refinement, the substrate layer has a larger area than the semiconductor layer stack arranged on the substrate layer.

The substrate layer preferably comprises a thickness between 50 µm and 120 µm or between 50 µm and 250 µm. In a refinement, in the case of p-doping, the substrate layer has a concentration in a range between $1 \cdot 10^{17}$ cm$^{-3}$ up to $2 \cdot 10^{18}$ cm$^{-3}$ or up to $8 \cdot 10^{18}$ cm$^{-3}$.

The semiconductor layers are preferably produced epitaxially on top of one another. The cathode layer or the anode layer is particularly preferably formed by a substrate layer on which all further semiconductor layers are grown epitaxially one after the other. Alternatively, layers are connected by means of a wafer bond.

In addition, the semiconductor diode can have further layers made of other materials, in particular metallic terminal contact layers.

It should be noted further that the term anode may be used synonymously with the term anode layer and the term cathode with the term cathode layer.

The terminal contact layers include, for example, completely or partially of a metal, e.g., gold, or of a metal alloy and are produced, for example, by means of electron beam evaporation or by means of sputtering.

The cathode layer region and the anode layer region adjacent to a terminal contact layer can have a higher dopant concentration than the respective further part of the cathode layer and the anode layer in order to form an electrical contact with the lowest possible resistance and to keep the series resistance or power dissipation of the semiconductor diode as low as possible.

At least over a relatively small thickness, i.e., preferably less than 1 µm, it is possible to produce a very heavy doping in GaAs layers or GaAs-based layers, in particular a doping of at least $1 \cdot 10^{19}$ cm$^{-3}$, with a good layer quality. Suitable dopants for this, in particular for the cathode layer, are tellurium or selenium, for example.

Accordingly, the layer thickness of the second section of the cathode layer depends substantially on the lifetime or the penetration depth of the minority charge carriers, i.e., the holes. Typically, a few hundred nanometers up to a maximum of 2 µm are sufficient as a layer thickness of the second layer.

Stated differently, the thickness of the second section of the cathode layer can be as thick as the free path length of the minority charge carriers, i.e., the holes in the cathode.

Furthermore, the delta layer section forms, as it were, a barrier for the minority charge carriers and reduces the terminal resistance. The turn-off behavior and, as a result, the switching behavior of the diode in particular are improved by the delta layer section.

Investigations have shown that the emitter efficiency, i.e., the efficiency of the cathode, can be improved with a combination of a thin but very heavily doped delta layer section and a second, less doped section of the cathode layer.

In combination with the lightly doped drift region, diodes with particularly high reverse voltages of over 1100 V or even over 1200 V, small on-state resistances, and particularly low capacitances per area can be produced.

The cathode layer can have a second layer section with a lower dopant concentration than the dopant concentration of the delta layer section, so that the delta layer section supplements a typical cathode layer, as it were, with a delta doping peak.

The delta layer section can have a material connection with a second metallic terminal contact. Stated differently, the metallic terminal contact is arranged on a top side of the cathode layer.

A first metallic terminal contact can be located on a bottom side of the anode layer. The two metallic terminal contacts preferably cover the anode layer and/or the cathode layer in a central area or almost completely or completely in order to achieve a low terminal resistance. It is understood that even with a complete overlap, a peripheral edge section is not metallized in order to increase process reliability.

The second layer section of the cathode layer can have a lower dopant concentration than the delta layer section. The second layer section of the cathode layer can have a greater layer thickness $D_{K2}$ than the delta layer section.

The second layer section of the cathode layer can have a thickness of at least 0.5 μm to a maximum of 1·5 μm or of at least 0.5 μm to a maximum of 2·5 μm or of at least 0.5 μm to a maximum of 5 μm.

It should be noted that the term doping and the term dopant concentration may be used synonymously. Furthermore, it should be noted that the change in doping between the delta layer section and the second section of the cathode layer preferably takes place abruptly. Stated differently, the doping preferably changes within a thickness range of less than 0.1 μm or less than 0.05 μm.

The dopant concentration of the second layer section of the cathode layer is below $1 \cdot 10^{19}$ cm$^{-3}$. The dopant concentration of the second layer section of the cathode layer is preferably above $1 \cdot 10^{18}$ cm$^{-3}$ or $2 \cdot 10^{18}$ cm$^{-3}$ or $5 \cdot 10^{18}$ cm$^{-3}$.

The cathode layer can have a transition layer section, wherein the transition layer section is arranged between the second section of the cathode layer and the drift region, and has a layer thickness of at least 3 μm, a lower doping than the doping of the second section, a higher doping than the drift region, and a doping concentration gradient that decreases convexly or concavely or linearly or in a stepped manner in the direction of the drift region.

Further, the delta layer section can have Te and/or Se as the dopant.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
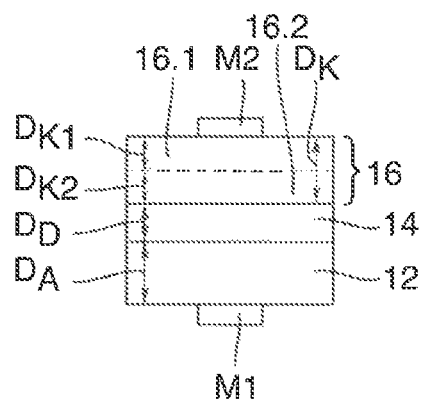
FIG. 1 is a view of an example of a stacked III-V semiconductor diode.

The illustration in FIG. 1 shows a view of an example of a stacked III-V semiconductor diode 10 comprising GaAs or consisting of GaAs. A heavily doped p-doped substrate layer with a total thickness $D_A$ forms an anode layer 12, on which drift region 14 with a total thickness $D_D$ followed by a heavily n-doped cathode layer 16 with a layer thickness $D_K$ is arranged.

It is understood that a PN junction is formed within drift region 14.

Cathode layer 16 has a first section 16.1 and a second section 16.2.

The first section 16.1 of cathode layer 16 is formed as a delta layer section with a very high dopant concentration of at least $1 \cdot 10^{19}$ cm$^{-3}$ or at least $2 \cdot 10^{19}$ cm$^{-3}$ and a low layer thickness $D_{K1}$ of from 0.1 μm to 1 μm or of from 0.1 μm to a maximum of 2 μm.

The second layer section 16.2 has a lower dopant concentration than the delta layer section 16.1 and a greater layer thickness $D_{K2}$.

The layer thickness of second layer section 16.2 of cathode layer 16 has a thickness in a range between 0.5 μm and 1·5 μm or in a range between 0.5 μm and 2·5 μm or in a range between 0.5 μm and 5 μm.

The dopant concentration of second layer section 16.2 is below $1 \cdot 10^{19}$ cm$^{-3}$. The dopant concentration of second layer section 16.2 is preferably above $1 \cdot 10^{18}$ cm$^{-3}$ or $2 \cdot 10^{18}$ cm$^{-3}$ or $5 \cdot 10^{18}$ cm$^{-3}$.

A metallic terminal contact M1 is arranged on a bottom side of anode layer 12 and a metallic terminal contact M2 is arranged on a top side of cathode layer 16.

The two metallic terminal contacts M1, M2 preferably cover anode layer 12 and/or cathode layer 16 almost completely in order to achieve a low terminal resistance. Delta layer section 16.1 also has a material connection with second metallic terminal contact M2.

Figure 2:
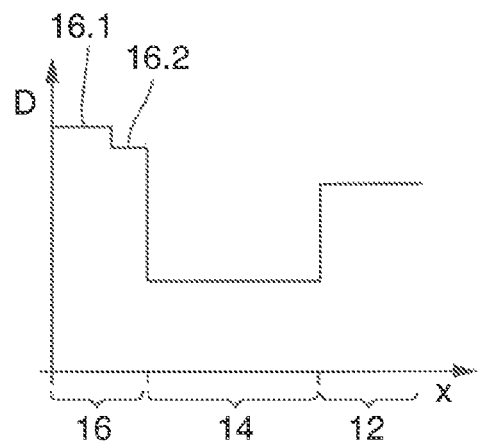
FIG. 2 is a view of an example of a dopant concentration gradient of a III-V semiconductor diode.

In the illustration in FIG. 2, a dopant concentration gradient is shown along the thickness of stacked III-V semiconductor diode 10, shown in connection with FIG. 1.

The dopant concentration D is plotted versus a position x along the stack of III-V semiconductor diode 10.

The dopant concentration gradient is formed to be constant over the respective layer thickness $D_{K2}$ and $D_{K1}$ of the two sections 16.2 and 16.1 of cathode layer 16, so that a dopant concentration jump forms between second layer section 16.2 and the delta layer section.

The dopant concentration then drops abruptly to a very low level in the region of drift region 14 of a maximum of $8 \cdot 10^{15}$ cm$^{-3}$. At the transition from drift region 14 to the anode layer, the dopant concentration rises abruptly to a uniformly high level of a p-dopant concentration.

The dopant concentration along the anode 12 is constant, wherein the level of the dopant concentration is smaller than the dopant concentration of second region 16.2 of cathode 16.

In the exemplary embodiment shown, the drift region has a low and substantially constant dopant concentration. In this case, the doping changes between an n-dopant or a p-dopant along the entire layer thickness, so that a PN junction forms in drift region 14.

Figure 3:
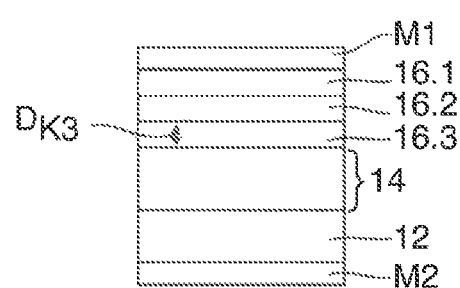
FIG. 3 is a view of an example of the stacked III-V semiconductor diode.

In an example shown in FIG. 3, the metallic terminal contacts M1 and M2 are formed flat.

In addition to first section 16.1 and second section 16.2, cathode layer 16 has a transition layer section 16.3. Transition layer section 16.3 has a layer thickness $D_{K3}$ of at least 3 μm and, for example, of at most 10 μm or of at most 5 μm.

Transition layer section 16.3 of cathode layer 16 has a lower doping than the doping of second section 16.2 of cathode layer 16 and a higher doping than drift region 14.

The concentration gradient of the doping, decreasing within transition layer section 16.3, in the direction of drift region 14 is formed convex or concave or linear or step-shaped.

Figure 4:
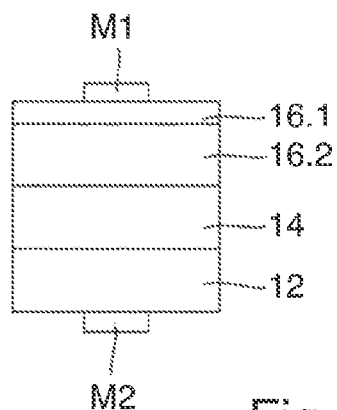
FIG. 4 is a view of an example of the stacked III-V semiconductor diode.

In an example in FIG. 4, the two metallic contact layers M1, M2 each cover only a central part of the anode or the cathode. Transition layer section 16.3 is not formed, so that second section 16.2 of the cathode is directly adjacent to drift region 14.

Figure 5:
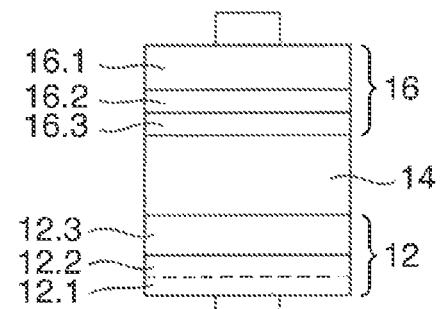
FIG. 5 is a view of an example of the stacked III-V semiconductor diode.

In an example shown in FIG. 5, cathode layer 16 has transition layer section 16.3 in addition to second layer section 16.2.

A p-doped transition layer section 12.3 is formed as part of anode layer 12 between drift region 14 and second section 12.2 of anode layer 12.

The dopant concentration of transition layer section 12.3 of the anode increases along the layer thickness of transition layer section 12.3 in the direction of second section 12.2 of anode layer 12. The increase in doping is formed concave or convex or linear or step-shaped.

Figure 6:
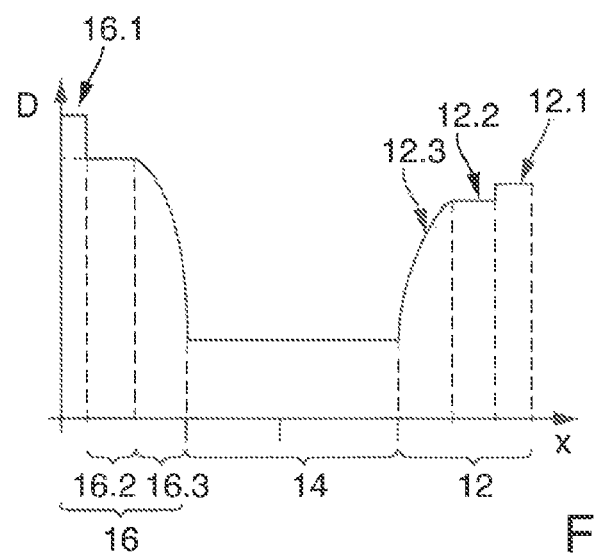
FIG. 6 is a view of an example of the dopant concentration gradient.

The dopant concentration gradient for the embodiment shown in connection with FIG. 5 is shown in the illustration in FIG. 6. Only the differences from the embodiment in FIG. 2 will be explained below.

Delta layer section 16.1 of cathode layer 16 is arranged on a side of second layer section 16.2, said side facing away from drift region 14, so that the dopant concentration drops abruptly along the cathode layer in the direction of drift region 14.

Transition layer section 16.3 is in turn formed as part of cathode layer 16 between second section 16.2 of cathode layer 16 and drift region 14.

The dopant concentration decreases in transition layer section 16.3 of cathode layer 16 in the further course in the direction of drift region 14.

A p-doped transition layer section 12.3 is formed as part of anode layer 12 between drift region 14 and second section 12.2 of anode layer 12. The dopant concentration in transition layer section 12.3 of anode layer 12 increases in the further course in the direction of drift region 12.2 of anode layer 12.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising GaAs, and comprising:
    a heavily n-doped cathode layer;
    a heavily p-doped anode layer; and
    a drift region arranged between the cathode layer and the anode layer with a dopant concentration of at most $8 \cdot 10^{15}$ cm$^{-3}$, a layer thickness of at least 10 µm, and a maximum of 100 µm,
    wherein the cathode layer has a first section of the cathode layer and a second section of the cathode layer, and the first section of the cathode layer is formed as a delta layer section with a layer thickness between 0.1 µm and 2 µm and a dopant concentration of at least $1 \cdot 10^{19}$ cm$^{-3}$, and
    wherein the second section of the cathode layer has a dopant concentration of less than $1 \cdot 10^{19}$ cm$^{-3}$ and above $1 \cdot 10^{18}$ cm$^{-3}$.

2. The stacked III-V semiconductor diode according to claim 1, wherein the delta layer section is materially adjacent to a metallic cathode contact layer.

3. The stacked III-V semiconductor diode according to claim 1, wherein the second section of the cathode layer has a lower dopant concentration than the delta layer section.

4. The stacked III-V semiconductor diode according to claim 1, wherein the second section of the cathode layer has the dopant concentration of above $2 \cdot 10^{18}$ cm$^{-3}$.

5. The stacked III-V semiconductor diode according to claim 1, wherein the second section of the cathode layer has a layer thickness between 0.5 µm and 5 µm.

6. The stacked III-V semiconductor diode according to claim 1,
    wherein the cathode layer has a transition layer section,
    wherein the transition layer section is arranged between the second section of the cathode layer and the drift region and has a layer thickness of at least 3 µm, and the transition layer section has a lower dopant concentration than the second section of the cathode layer and a higher dopant concentration than the drift region, and
    wherein the dopant concentration of the transition layer section has a dopant concentration gradient decreasing convexly or concavely or linearly or in a stepped manner in a direction of the drift region.

7. The stacked III-V semiconductor diode according to claim 1,
    wherein the anode layer has a first section of the anode layer and a second section of the anode layer arranged between the first section of the anode layer and the drift region, and
    wherein a dopant concentration of the second section of the anode layer is less than a dopant concentration of the first section of the anode layer, or the dopant concentration of the second section of the anode layer is the same as the dopant concentration of the first section of the anode layer.

8. The stacked III-V semiconductor diode according to claim 7, wherein the dopant concentration of the first section of the anode layer is at least $8 \cdot 10^{17}$ cm$^{-3}$ and at most $8 \cdot 10^{18}$ cm$^{-3}$, and the dopant concentration of the second section of the anode layer is at least $1 \cdot 10^{17}$ cm$^{-3}$ and at most $8 \cdot 10^{17}$ cm$^{-3}$.

9. The stacked III-V semiconductor diode according to claim 7,
    wherein the anode layer has a transition section adjacent to the drift region,
    wherein the transition section has a dopant concentration gradient that decreases convexly or concavely or linearly or in a stepped manner in a direction of the drift region, and has a dopant concentration greater than the dopant concentration of the drift region that is p-doped and less than the dopant concentration of the second section of the anode layer.

10. The stacked III-V semiconductor diode according to claim 7, wherein the second section of the anode layer has a lower doping than the second section of the cathode layer.

11. The stacked III-V semiconductor diode according to claim 7, wherein the dopant concentration of the first section of the anode layer is at most $4 \cdot 10^{18}$ cm$^{-3}$.

12. The stacked III-V semiconductor diode according to claim 1, wherein the delta layer section has Te or Se as a dopant.

13. The stacked III-V semiconductor diode according to claim 1, wherein the layer thickness of the drift region is at most 80 µm.

14. The stacked III-V semiconductor diode according to claim 1, wherein the layer thickness of the first section of the cathode layer is between 0.1 μm and 1 μm.

15. The stacked III-V semiconductor diode according to claim 1, wherein the dopant concentration of the first section of the cathode layer is at least $2 \cdot 10^{19}$ cm$^{-3}$.

16. The stacked III-V semiconductor diode according to claim 1, wherein the dopant concentration of the second section of the cathode layer is above $5 \cdot 10^{18}$ cm$^{-3}$.

17. The stacked III-V semiconductor diode according to claim 1, wherein the second section of the cathode layer has a layer thickness between 0.5 μm and 1.5 μm.

18. The stacked III-V semiconductor diode according to claim 1, wherein the second section of the cathode layer has a layer thickness between 0.5 μm and 2.5 μm.

* * * * *